United States Patent [19]

Beguwala et al.

[11] 4,279,069
[45] Jul. 21, 1981

[54] FABRICATION OF A NONVOLATILE MEMORY ARRAY DEVICE

[75] Inventors: Moiz M. E. Beguwala, Placentia; Francis M. Erdmann, Anaheim, both of Calif.

[73] Assignee: Rockwell International Corporation, El Segundo, Calif.

[21] Appl. No.: 13,351

[22] Filed: Feb. 21, 1979

[51] Int. Cl.³ ............................................ H01L 21/26
[52] U.S. Cl. ..................................... 29/571; 29/591; 148/1.5; 148/187; 357/41; 357/23
[58] Field of Search ................... 29/571, 591; 357/41, 357/23; 148/187, 1.5

[56] References Cited

U.S. PATENT DOCUMENTS

| 3,890,632 | 6/1975 | Ham et al. | 357/23 |
| 3,974,515 | 8/1976 | Ipri et al. | 357/23 |
| 3,978,577 | 9/1976 | Bhattacharyya et al. | 29/571 |
| 4,002,501 | 1/1977 | Tamura | 148/175 X |
| 4,057,824 | 11/1977 | Woods | 357/56 |
| 4,072,974 | 2/1978 | Ipri | 357/42 |
| 4,075,754 | 2/1978 | Cook | 29/571 |

FOREIGN PATENT DOCUMENTS 2284983  4/1976  France .

OTHER PUBLICATIONS

Saito et al., 2419 *Jan. J. of Applied Physics*, vol. 15, No. 7, 1976 Supp., pp. 185–190.
Cricchi et al., *IEEE Trans. on Nuclear Sci.*, vol. NS-24, No. 6, Dec. 1977, pp. 2185–2189.

*Primary Examiner*—G. Ozaki
*Attorney, Agent, or Firm*—H. Fredrick Hamann; Wilfred G. Caldwell

[57] ABSTRACT

There is shown and described a memory array using MNOS/MOS transistors. The memory devices are nonvolatile, metal-nitride-oxide-semiconductor (MNOS) variable threshold voltage transistors and the metal-oxide semiconductor (MOS) input-output devices exhibit fixed threshold voltages. The MOS devices are fabricated first and the MNOS memory devices are fabricated thereafter. This memory gate last (MGL) arrangement eliminates the need for high temperature process steps after the formation of the MNOS device gate dielectric in the array devices. This operation results in an MNOS/MOS memory array which exhibits excellent ionizing radiation hardness characteristics as well as memory properties which are improved over present radiation hardened MNOS/MOS arrays.

7 Claims, 14 Drawing Figures

FABRICATION OF A NONVOLATILE MEMORY ARRAY DEVICE

The invention herein described was made in the course of or under a contract or subcontract thereunder, with the Army.

BACKGROUND OF THE INVENTION

1. Field of the Invention

This invention is directed at a memory device, in general, and to a memory device having a nonvolatile MNOS device and a fixed threshold MOS device, in particular.

2. Prior Art

There are many memory devices which are known in the art and which are fabricated in accordance with so-called standard memory gate first (MGF) techniques. The known techniques for fabricating MOS-type devices yield devices which have fixed threshold characteristics and which exhibit hardness to ionizing radiation. Likewise, it is known to fabricate MNOS devices which provide nonvolatile memory devices or transistors. However, it is generally not known to produce both of these types of devices in a single process inasmuch as the processing characteristics of each of the devices are different and impacts the processing of the other device in a deleterious manner. That is, if the MOS device is fabricated subsequent to the MNOS device in a single array, the MNOS device is adversely affected in terms of the characteristics of the dielectric gate layer and, hence, the memory properties thereof.

In addition, other characteristics of the respective devices are also adversely affected. Consequently, it is highly desirable to establish a process which will permit MNOS memory devices and MOS fixed threshold devices to be fabricated in the same array in a process which does not injuriously or disadvantageously affect the operation of the other devices.

SUMMARY OF THE INVENTION

This invention is directed to a memory array using nonvolatile MNOS devices and fixed threshold MOS devices. The process establishes the appropriate method of fabricating the devices in the appropriate order so that properly functioning devices can be made in the same array without adversely affecting the other types of devices. In particular, the memory gate is formed last to prevent damage thereto when the fixed threshold devices are formed.

BRIEF DESCRIPTION OF THE FIGURES

FIGS. 1a through 1j show various steps and stages in the MGL process of fabricating a memory array comprising an MNOS transistor and a fixed threshold voltage MOS transistor.

Referring now to FIG. 1a, there are shown the basic elements which are utilized to form the array of the present invention. The basic configuration comprises a composite which includes an insulating substrate 10 which can be fabricated of sapphire or other suitable material. The layer of silicon is formed on substrate 10 in any suitable fashion such as epitaxial chemical vapor deposition. The layer of silicon is then appropriately treated including masking, etching and the like to produce a plurality of silicon islands 12 and 14 on the surface of substrate 10. For convenience, the left island 12 is designated as the MOS fixed $V_T$ transistor. Conversely, the right island 14 is defined as the MNOS memory transistor. While only one of each of the transistors is shown in the illustrative figure, any appropriate number of devices can be fabricated using similar techniques to those described hereinafter. Also, the left portion of the respective diagrams will be used to show and describe the fabrication of the MOS device while the right side will be used to show and describe the fabrication of the MNOS device.

As shown in FIG. 1b the source and drain regions of the MOS and MNOS transistors are produced by the standard technique of the diffusion of boron into part of the silicon islands 12 and 14 from a boron doped silicon dioxide glass layer 16 which approximately 3000 Å thick in a preferred embodiment. Again, suitable masking and etching techniques are to define the source and drain regions to receive the boron diffusion. The region of the undoped silicon will constitute the gate region of the MOS and MNOS transistors. This region can vary from 10 μm to 2 μm or less dependent upon the design rules used to define the transistor geometries and the capability of lithographic and companion technologies. Of course, the source and drain regions of the MNOS and MOS transistors may be doped in any other suitable manner, such as ion implantation of boron ions or the like, to produce the same results.

Figure 1A:
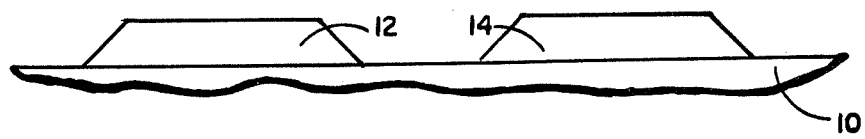
Figure 1B:
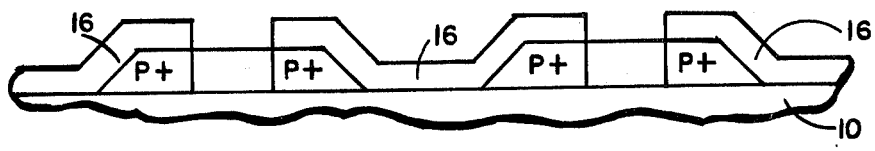
Figure 1C:
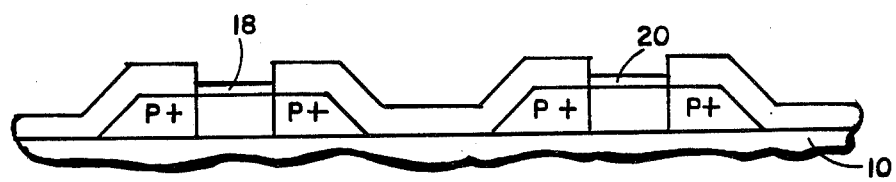

After the source and drain regions have been produced in the devices shown in FIG. 1b, thermal oxide layers 18 and 20 are grown on the devices shown in FIG. 1c. In particular, the layers 18 and 20 are produced by placing the composite shown in FIG. 1b in a suitable HCl-steam environment at 875° for 45 minutes to form silicon dioxide layers 18 and 20 in known fashion. The thickness of layers 18 and 30 is, typically, on the order of 700 angstroms. It will be seen that layer 18 will remain as the gate dielectric for the MOS device.

Figure 1D:
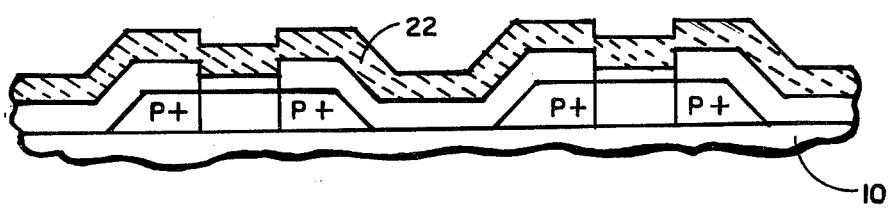

As soon as the thermal oxide layers 18 and 20 have been established to the appropriate thickness, a first layer of P+ polysilicon (or other suitable conductive material) is deposited over the entire composite as shown in FIG. 1d. The polysilicon layer is deposited in accordance with any suitable process such as chemical vapor deposition to a thickness of approximately 4000 Å.

Figure 1E:
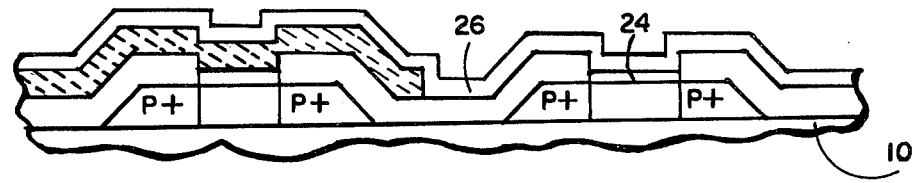

As shown in FIG. 1e, the portion of the first P+ polysilicon layer 22 and the thermal oxide layer 20 is removed from the gate region of the silicon island 14 (right portion of the device) for example by masking P+ polysilicon layer 22 and etching away the unmasked portion. In other words, P+ polysilicon layer 22 and thermal oxide layer 20 are removed from the MNOS transistor region while thermal oxide layer 18 and P+ polysilicon layer 22 remain in the MOS transistor region.

A thin memory oxide layer 24 is then grown in the gate region portion of the silicon island 14 in the MNOS transistor area. This thin layer serves as the oxide portion of the gate dielectric of the MNOS transistor and is on the order of 22 angstroms thick. Thereafter, a layer 26 of nitride is deposited onto the surface of the existing devices shown in FIG. 1e. Nitride layer 26 is deposited to a thickness of about 400 angstroms using a low pressure chemical vapor deposition (LPCVD) process which is known in the art. Nitride layer 26 will be the nitride portion of the gate dielectric of the MNOS transistor.

Figure 1F:
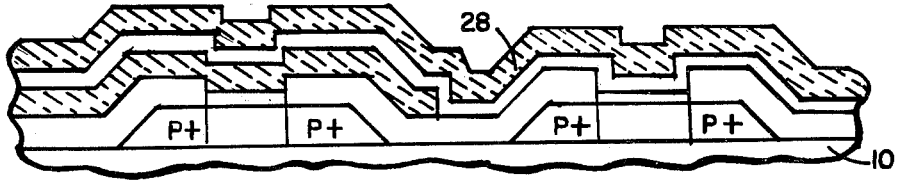

As shown in FIG. 1f, a second P+ polysilicon layer 28 is deposited over the nitride layer of the device as shown in FIG. 1e. The second P+ polysilicon layer is grown to a thickness of 4000 Å using typical operations and processes known in the art. Also, in the case of layer 28, any suitable conductive material can be utilized.

Again, masking and etching techniques are applied to the device shown in FIG. 1f to effectively remove the left portions of polysilicon layer 28 and nitride layer 26.

Figure 1G:
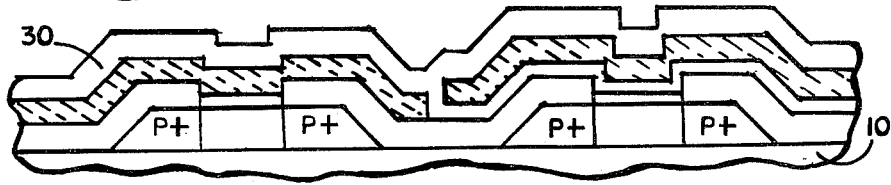

As shown in FIG. 1g, the structure which remains is then subjected to standard techniques for depositing silox over the entire surface of the memory array for the purpose of gate definition. The silox layer 30 is grown using standard techniques and is grown to a thickness of about 3000 angstroms. It is clear from the illustration in FIG. 1g that a silox layer is produced over the gate portions of the respective devices in the memory array.

Figure 1H:
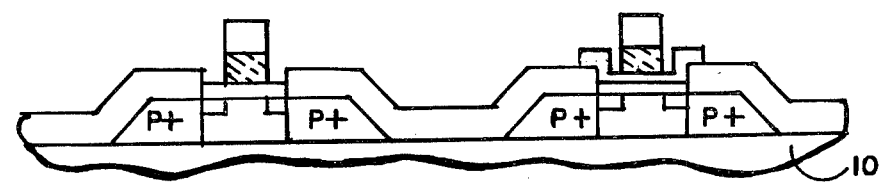

The device shown in FIG. 1g is then masked and etched in suitable fashion in order to establish the device configuration shown in FIG. 1h. That is, portions of silox layer 30, second poly layer 28, first poly layer 22 and other respective layers are removed except in the selected areas substantially directly above the gate or channel portions of the respective MOS and MNOS devices. As shown in FIG. 1h, the gate portions are defined so that the P+ polysilicon layers 28 and 22 and the silox layer 30 are narrower than the gap between the source and drain areas of the MOS device. The shoulder areas between the edges of the dielectric layers and the source or drain regions are then implanted with boron, using suitable ion implantation techniques, with the appropriate dose and energy so that extended implanted source and drain regions are established. This technique has the effect of extending the source and drain regions into the channel area and, thus, controlling the exact definition of the source/drain areas relative to each other and to the gate area. This process results in a self-aligned-gate type of MNOS and MOS transistor.

A similar effect is noted in the MNOS region with the additional feature that the implantation is conducted through the remaining portion of nitride layer 24. Nevertheless, the extended source and drain regions are used to define the gate channel region of the MNOS device and to produce a self-aligned gate device.

Figure 1I:
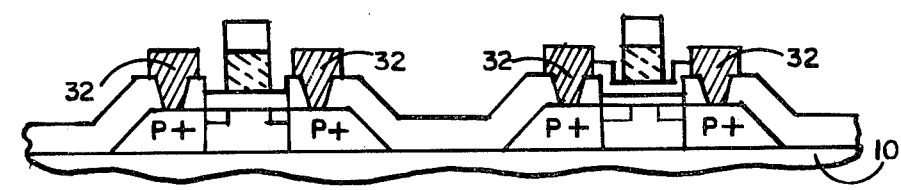

As shown in FIG. 1i, the remaining P+ doped glass layer 16 is now masked and etched to establish openings therethrough to the respective source and drain regions. A layer of aluminum or other suitable electrically conductive material is provided over the device or array. By suitable masking, the conductor layer is defined to establish the contacts 32 to the respective source and drain regions of the devices in question. Thereafter, appropriate sintering or other techniques can be utilized. In addition, protective or passivating layers can be established as desired. However, this type of layer or surface is not shown and described herein inasmuch as it is a standard well-known technique. Also, it is standard technique to establish offset contacts to the gate polysilicon electrodes 22 and 28 for MOS and MNOS devices which contacts do not appear in FIG. 1i.

Figure 2:
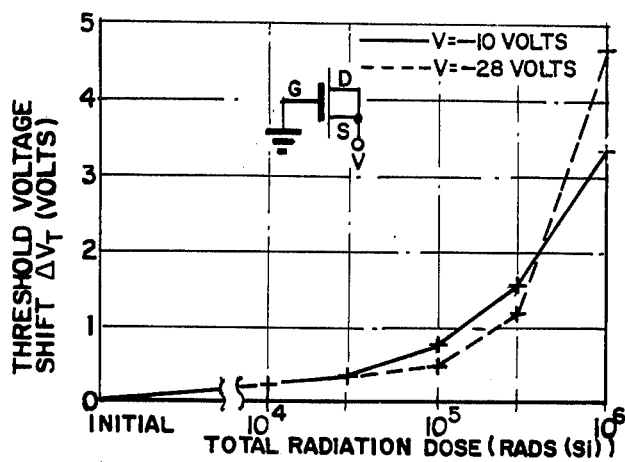
FIG. 2 is a chart showing the threshold voltage shift of a transistor, fabricated by the described MGL process, as a function of the total dose of ionizing radiation.

Referring now to FIG. 2, there is shown a chart which shows the threshold voltage shift $V_T$ of a P+ polysilicon gate MOS transistor fabricated by the radiation hardened MGL process as a function of the total dose of ionizing radiation applied thereto. In the examples shown, an external bias condition of $-10$ volts is represented by the solid line while an external bias condition of $-24$ volts is represented by the dashed line. The threshold voltage shift ($\Delta V_T$) is substantially similar to the "state of the art" radiation hardened MOS transistors. Also it is clear that the $\Delta V_T$ shift is less than 5 volts for a total radiation dose of $10^6$ RADS in silicon. This chart show the radiation performance of discrete MOS transistors.

Figure 3:
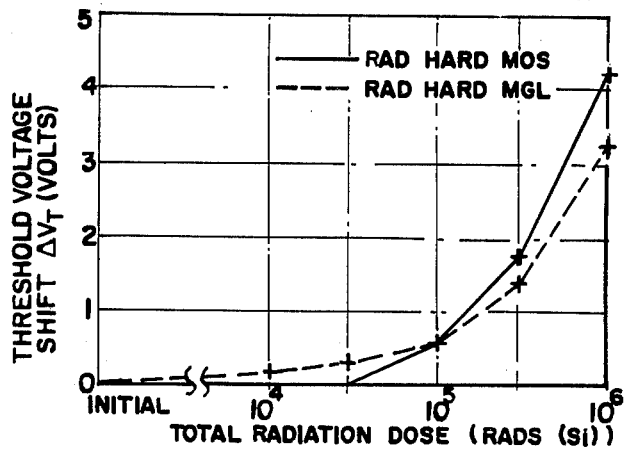
FIG. 3 is a chart showing a comparison of threshold voltage shift as a function of total dose ionizing radiation for two fixed $V_T$ transistors, one fabricated by a standard radiation hard MOS process and the other by the described MGL process.

In FIG. 3, there is shown a comparison of threshold voltage shifts as a function of the total dose ionizing radiation for two fixed $V_T$ transistors. One of the transistors (represented by the solid line) is fabricated with state of the art radiation hardened processes. Conversely, the other transistor (represented by the dashed lines) is made by the radiation hardened MGL process. Again, it is seen that the radiation hardness of the two devices is comparable.

Figure 4:
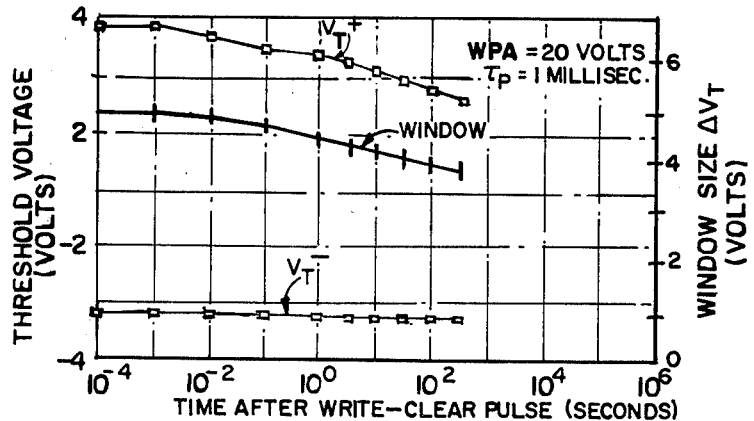
FIG. 4 is a chart showing charge retention properties of a typical transistor fabricated by a radiation hard memory gate last process.

Referring to FIG. 4, there is shown a chart of the charge retention properties of typical P+ polysilicon gate MNOS transistors fabricated by the radiation hard memory-gate-last process of the instant invention. This characteristic of the MNOS device exhibits an extrapolated retention time of approximately $1 \times 10^{15}$ seconds. This is approximately four to five orders of magnitude better than the retention time measured on the radiation hardened MNOS devices fabricated by the memory-gate-first process which is the previously known process for producing this type of device or array.

Figure 5:
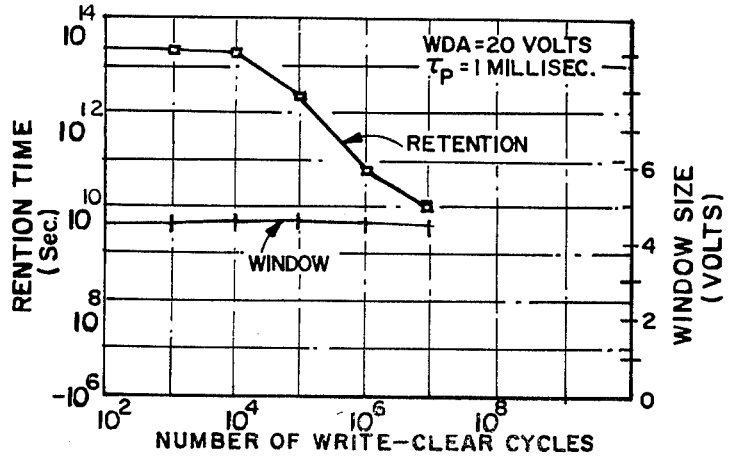
FIG. 5 is a chart showing the endurance of a typical P-type transistor fabricated by the radiation hard memory gate last process.

Referring to FIG. 5, there is shown a chart which illustrates the endurance of a typical P+ polysilicon gate MNOS transistor fabricated by the radiation hard memory-gate-last process of the instant invention. FIG. 5 shows the endurance characteristic of the MNOS device fabricated in the manner described above. The device exhibits an improved endurance retention characteristic as compared to devices made by the formerly known MGL process.

Thus, there has been shown and described an array or device and a fabrication process which permits the fabrication of an MNOS nonvolatile memory array wherein the memory gate dielectric is formed after the gate dielectric of the fixed threshold voltage device is grown. The gate dielectric of the fixed threshold voltage device is a pure, thermally grown, silicon dioxide layer. The silicon dioxide layer is protected during the subsequent nitride deposition by a polysilicon layer. It has been shown that the radiation hardness characteristic of the fixed threshold voltage device was not altered by the subsequent nitride deposition. In addition, it appears that the bias-temperature stability of the transistor characteristics of the fixed threshold device are increased substantially over dual dielectric gate devices and devices wherein the nitride layer is deposited directly on the oxide layer and subsequently removed. The potential yield of functional arrays is increased substantially by the use of the process described hereinabove compared to the process previously known wherein the nitride layer is deposited directly on the oxide layer and then removed. This increase in yield is provided because of the decreased probability of pinholes and other etch related defects occurring in the oxide layer.

The process shown and described herein is intended to be illustrative only. The particular parameters and characteristics which are shown and described in the description are intended to be illustrative only and are not intended to be limitative of the instant invention. The best known mode of operation and apparatus is included within the steps and parameters shown and described. However, it is clear that others skilled in the art, and beginning with the teachings herein described may define improved detailed process parameters and characteristics. However, such improvements which fall within the scope of this description are intended to be included herein as well. The scope of this invention is limited only by the claims appended hereto.

Having thus described a preferred embodiment of the instant invention, what is claimed is:

1. Forming a memory array having fixed threshold MOS and memory MNOS devices by the process of
   defining active device regions of semiconductor material of a substrate,
   diffusing dopants into portions of said active regions to form source and drain regions therein,
   producing a first dielectric layer over the channel portions of said active regions between the source and drain regions in said active regions,
   producing a first layer of conductive material over said first dielectric layer,
   removing said first dielectric layer and said first conductive layer from the regions to be formed into MNOS memory devices,
   said first layer of conductive material and first dielectric layer remaining over the active regions of the MOS defined regions,
   producing a second dielectric layer of ultra-thin oxide over the MNOS channel portions of said active regions from which said first dielectric layer and said first conductive layer have been removed,
   producing a third dielectric layer of nitride over the array,
   producing a second layer of conductive material over said third dielectric layer,
   removing portions of said third dielectric layer and said second layer of conductive material from the regions where the MOS devices are formed which are areas different from the first mentioned removing step,
   producing a protective masking layer over the first and second conductive layers to be used to define the channel regions of said devices which will become the active channel regions,
   providing dopants to said channel region of all of said active regions between the edge of said protective masking layer and the respective edge of the associated source and drain regions, and
   establishing electrical connections to each source, gate and drain region.

2. The process for providing the array recited in claim 1 wherein:
   said first dielectric layer is an oxide of the semi-conductor material of said active regions.

3. The process for producing the array recited in claim 1 wherein:
   said first and second layers of conductive material are formed of polysilicon.

4. The process for producing the array recited in claim 1 wherein:
   said substrate is formed of silicon on an electrically insulating material.

5. The process for producing the array recited in claim 1 wherein:
   said protecting masking layer is formed of silox.

6. The process for producing the array recited in claim 1, wherein:
   said dopants are provided to the channel regions of said active regions by ion implantation.

7. The process for producing the array recited in claim 1 wherein:
   said dopants are diffused into said active regions to form source and drain regions by first providing a layer of boron doped glass over portions of said active regions and driving the boron into the active regions.

* * * * *